(12) United States Patent
Chen et al.

(10) Patent No.: US 9,822,921 B2
(45) Date of Patent: Nov. 21, 2017

(54) SUPPORTING STAND FOR DISPLAY DEVICE

(71) Applicant: SYNCMOLD ENTERPRISE CORP., New Taipei (TW)

(72) Inventors: Kuang-Po Chen, New Taipei (TW); Kun-Tien Ting, New Taipei (TW); Wen-Chen Liu, New Taipei (TW); Li-Wei Shih, New Taipei (TW)

(73) Assignee: Syncmold Enterprise Corp., New Taipei (TW)

( * ) Notice: Subject to any disclaimer, the term of this patent is extended or adjusted under 35 U.S.C. 154(b) by 0 days.

(21) Appl. No.: 15/207,730

(22) Filed: Jul. 12, 2016

(65) Prior Publication Data

US 2017/0051865 A1     Feb. 23, 2017

(30) Foreign Application Priority Data

Aug. 21, 2015   (TW) .............................. 104213500 U

(51) Int. Cl.

| | |
|---|---|
| *H05K 7/00* | (2006.01) |
| *F16M 11/04* | (2006.01) |
| *H05K 5/00* | (2006.01) |
| *H05K 5/02* | (2006.01) |
| *H01R 33/05* | (2006.01) |
| *H01R 33/94* | (2006.01) |

(Continued)

(52) U.S. Cl.
CPC ......... *F16M 11/041* (2013.01); *F16M 11/046* (2013.01); *F16M 11/10* (2013.01); *F16M 11/105* (2013.01); *F16M 11/2014* (2013.01); *H01R 33/05* (2013.01); *H01R 33/94* (2013.01); *H05K 5/0017* (2013.01); *H05K 5/0234* (2013.01); *H05K 5/0247* (2013.01); *F16B 2001/0064* (2013.01)

(58) Field of Classification Search
CPC .. F16M 11/046; F16M 11/10; F16M 11/2014; A47B 97/00; A47B 2097/003; A47B 2097/005; H05K 5/0234; H05K 5/0247; H05K 5/0017
See application file for complete search history.

(56) References Cited

U.S. PATENT DOCUMENTS

| | | | |
|---|---|---|---|
| 6,268,997 B1 | 7/2001 | Hong | |
| 7,430,113 B2 * | 9/2008 | McRight | F16M 11/105 248/917 |

(Continued)

*Primary Examiner* — Robert J Hoffberg
*Assistant Examiner* — Hung Dang
(74) *Attorney, Agent, or Firm* — Muncy, Geissler, Olds & Lowe, P.C.

(57) ABSTRACT

Disclosed is a supporting stand for a display device, which includes: a base; an upright connected to the base; a holding unit connected to the upright and including a bracket, wherein the bracket has an anode conductive portion and a cathode conductive portion to provide electrical contacts for the display device; an electrical function unit disposed within the base; and an electrical connection unit electrically connecting the electrical function unit to the anode and cathode conductive portions of the bracket. Accordingly, the display device can be disposed in contact with the anode and cathode conductive portions of the bracket when being mounted on the bracket, and be electrically connected to the electrical function unit at the base by the electrical connection unit.

15 Claims, 8 Drawing Sheets

(51) Int. Cl.
 *F16M 11/20* (2006.01)
 *F16M 11/10* (2006.01)
 *F16B 1/00* (2006.01)

(56) References Cited

U.S. PATENT DOCUMENTS

| | | | |
|---|---|---|---|
| 2007/0194182 A1* | 8/2007 | Lee | F16M 11/10 248/125.9 |
| 2009/0001239 A1* | 1/2009 | Dong | F16M 11/105 248/393 |
| 2009/0179133 A1* | 7/2009 | Gan | F16M 11/105 248/422 |
| 2012/0019990 A1* | 1/2012 | Segar | F16M 11/08 361/679.01 |
| 2017/0051866 A1* | 2/2017 | Chen | F16M 11/046 |

* cited by examiner

SUPPORTING STAND FOR DISPLAY DEVICE

CROSS REFERENCE TO RELATED APPLICATION

This application claims the benefits of the Taiwan Patent Application Serial Number 104213500, filed on Aug. 21, 2015, the subject matter of which is incorporated herein by reference.

BACKGROUND OF THE INVENTION

1. Field of the Invention

The present invention relates to a supporting stand and, more particularly to, a supporting stand provided with conductive portions at the location for mounting a display device.

2. Description of Related Art

Disclosed in U.S. Pat. No. 6,268,997 B1 is a flat-panel display apparatus that includes a display unit and a stand unit with an interface circuit board and a speaker installed in its base. By virtue of a cable, the interface circuit board is electrically connected to a main circuit board in the display unit. As both opposite ends of the cable are directly coupled to the interface circuit board and the main circuit board without any connectors for detachable attachment, the design is not propitious for releasing the display unit from the stand unit. In consideration of detachability, most stands are provided with an external cable at its base so that the circuit board in the base can be electrically connected to a display device mounted on the stand by inserting the plug of the external cable into the adapter of the display device. However, the external cable extending from the base of the stand to the display device would cause lack of cohesive (one-piece) feel in the appearance of the stand, and even be easily pulled and broken due to improper or inadvertent operation.

For the reasons stated above, an urgent need exists to develop a new supporting stand that can address the aforementioned drawbacks.

SUMMARY OF THE INVENTION

An objective of the present invention is to provide a supporting stand for a display device, which is characterized by the provision of conductive portions at the location for mounting the display device. By virtue of the conductive portions for electrical connection with the display device mounted on the supporting stand, an electrical function unit built in the supporting stand can be electrically connected to the display device. Additionally, the conductive portions are also beneficial for a detachable supporting stand because the display device can be easily separated from the conductive portions of the supporting stand when detaching the display device therefrom.

In accordance with the foregoing objectives, the present invention provides a supporting stand for a display device, including a base, an upright, a holding unit, an electrical function unit and an electrical connection unit. The upright is connected to the base, whereas the holding unit is connected to the upright and includes a bracket for mounting the display device thereon. The bracket has an anode conductive portion and a cathode conductive portion for electrical contact with an anode contact and a cathode contact of the display device, respectively. The electrical function unit is disposed within the base, and the electrical connection unit extends through the interior of the upright and provides electrical connection between the electrical function unit and the anode/cathode conductive portions of the bracket.

Accordingly, the anode and cathode conductive portions of the bracket can be brought into abutment against the anode and cathode contacts of the display device, respectively, while mounting the display device on the bracket. As such, the display device in electrical contact with the anode and cathode conductive portions of the bracket can be electrically connected to the electrical function unit through the electrical connection unit, resulting in an electrical loop. Additionally, the association of the electrical connection unit with the bracket, but not with the display device, is advantageous to a detachable supporting stand. In particular, compared to the traditional plugging-in manner for electrical connection, the anode and cathode conductive portions can address quick connection/disconnection requirements and thus are more suitable for the supporting stand configured with quick-release capability. This is because the installation of the display device on the bracket would lead the display device to be electrical contact with the conductive portions of the bracket, without the need of any additional plugging-in action.

In the present invention, the anode and cathode conductive portions of the bracket can be designed into any structure capable of being electrically connected to the display device mounted on the bracket according to practical requirement. For instance, in consideration of the quick-release capability of the supporting stand, a pin connector may be used as the anode conductive portion of the bracket for direct electrical contact with the anode contact of the display device mounted on the bracket. Besides, a main plate may be used to serve as the cathode conductive portion of the bracket and to define a mounting plane for the display device. Accordingly, when the display device is mounted on the bracket, the cathode contact of the display device can be placed in electrical contact with a contact region of the main plate. The pin connector and the main plate are not limited to particular arrangement, as long as the pin connector and the main plate keep electrically isolated from each other and can be brought into electrical contact with the anode and cathode contacts of the display device, respectively. For instance, the pin connector can be disposed to extend through an open slot formed in the main plate, and have a front portion in contact with the display device installed on the front side of the main plate and a rear portion secured to the rear side of the main plate by any fastening means. The anode and cathode conductive portions of the bracket are not limited to the aforementioned pin connector and main plate, and may be any other structure for electrical contact with the display device.

The aforementioned main plate can be designed into non-adjustable or rotatable type. In a preferred embodiment of the present invention, the main plate is configured to be rotatable in the mounting plane, so that the display device can be adjusted into portrait orientation, landscape orientation or other angle orientations by rotation of the main plate. For the aspect of the main plate being rotatable, the pin connector preferably is maintained stationary while rotation of the main plate. As a result, the stationary pin connector would not result in any undesired pulling on the electrical connection unit associated with the pin connector. Further, as the relative position of the pin connector at the open slot would change with rotary motion of the main plate, the display device may be provided with an additional anode contact for electrical connection with the pin connector when the display device is rotated to another orientation. For instance, the display device can be provided with two anode contacts for electrical contact with the pin connector when the main plate is placed at 0° and 90° orientation, respectively. Consequently, the display device in 0° (portrait) or 90° (landscape) orientation can be electrically connected to the electrical function unit at the base. Additionally, the open slot of the main plate preferably is shaped according to the relative motion trajectory between the pin connector and the main plate induced by the rotary motion of the main plate, so that the pin connector would not interfere with the rotary motion of the main plate. In accordance with a preferred embodiment of the present invention, the bracket further has a fixing plate and a shaft assembly, wherein the pin connector is fastened on the fixing plate, and the main plate and the fixing plate are pivotally attached to the shaft assembly. At a result, the main plate can rotate about the shaft assembly, and the fixing plate is maintained stationary while rotation of the main plate.

In the present invention, the anode/cathode conductive portions of the bracket can be electrically coupled to the electrical connection unit in any manner without particular limitation, as long as the electrical connection unit can provide electrical connection between the anode/cathode conductive portions and the electrical function unit. For instance, in accordance with a preferred embodiment of the present invention, the electrical connection unit has a first cable electrically connected to the pin connector and a second cable electrically connected to an electrical joint structure of the fixing plate. The electrical joint structure is placed in electrical contact with the main plate so as to provide electrical connection between the main plate and the second cable. As both opposite ends of the electrical connection unit are coupled with components of the supporting stand (namely, one end of the electrical connection unit being connected to the electrical function unit, and the other end being connected to the anode and cathode conductive portions of the bracket), the electrical connection unit can be integrated into the interior of the supporting stand so as to avoid exposed cables and give the supporting stand a cohesive (one-piece) feel. Preferably, the electrical connection unit includes a main cable received in the interior of the upright. Specifically, the main cable extends along the upright and has one end electrically connected to the electrical function unit and an opposite end electrically connected to the first and second cables. For the main cable, the first cable and the second cable, the selection of cable types can be made according to the requirement without particular restriction. In consideration of easy routing of the main cable received within the upright, the main cable preferably is a flexible cable.

In the present invention, based on the practical requirement for function, the electrical function unit may include, but is not limited to, a light emitting module, an input/output module, a control module, an audio module or/and other multimedia modules. Accordingly, the supporting stand not only provides mechanical support for the display device, but also may be provided with more diversified functions at the base according to user's demand.

In the present invention, the upright can be designed as non-adjustable or rotatable according to practical requirement. Preferably, the upright is rotatable with respect to the base so that the display device can be oriented toward the desired direction by pivot motion of the upright. In order to prevent the electrical connection unit from being pulled and broken in rotation of the upright, the main cable preferably has a reserve section in which twisting is allowed to be adapted to the pivot motion of the upright. More specifically, the supporting stand can further include a first organizer and a second organizer, and the reserve section of the main cable longitudinally extends through the first organizer and the second organizer in sequence in the direction toward the base. By the second organizer, the main cable is formed with a bent portion at the base and further laterally extends toward the electrical function unit. The first organizer can rotate synchronously with the upright, whereas the second organizer keeps stationary. As a result, the pivot motion of the upright would induce twisting in the reserve section of the main cable.

In the present invention, the holding unit can be configured as adjustable or non-adjustable in height according to requirement. Preferably, the holding unit is adjustable in height and can slide upward and downward in a channel formed in the upright. Accordingly, the display device can be adjusted to desired height for comfortable viewing. Further, in order to avoid breaking of the electrical connection unit caused by lifting and lowering motion of the holding unit, the main cable preferably has a free section corresponding to the channel. The free section of the main cable can be forced into bending and thus be adapted to the sliding motion of the holding unit.

The foregoing and other objects, advantages, and novel features of the invention will become more apparent from the following detailed description when taken in conjunction with the accompanying drawings.

DETAILED DESCRIPTION OF THE PREFERRED EMBODIMENT

Hereafter, example will be provided to illustrate the embodiments of the present invention. Advantages and effects of the invention will become more apparent from the disclosure of the present invention. It should be noted that these accompanying figures are simplified and illustrative. The quantity, shape and size of components shown in the figures may be modified according to practical conditions, and the arrangement of components may be more complex. Other various aspects also may be practiced or applied in the invention, and various modifications and variations can be made without departing from the spirit of the invention based on various concepts and applications.

Figure 1:
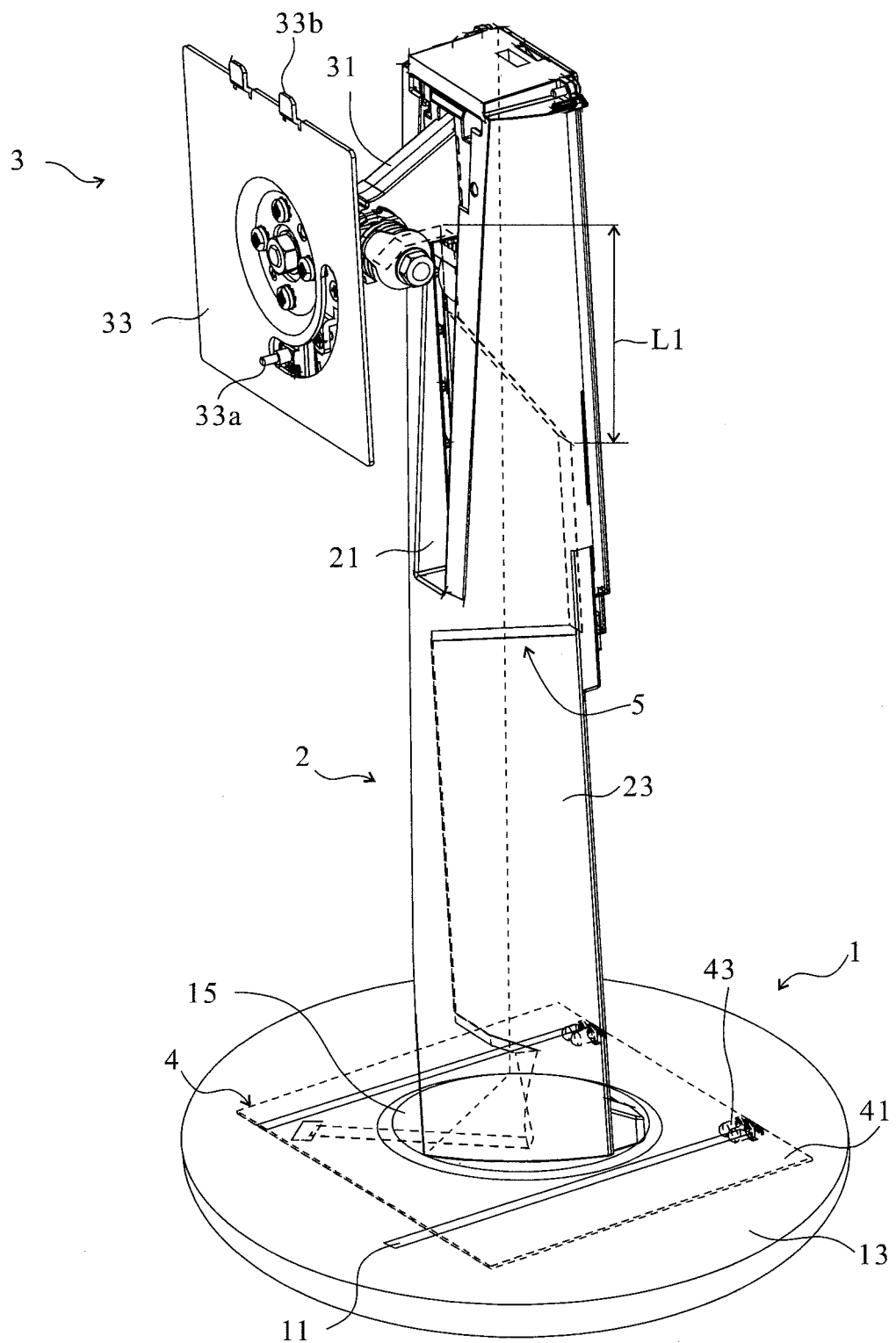
FIG. 1 is a perspective schematic view of a supporting stand in accordance with one embodiment of the present invention.

Please refer to FIG. 1, which is a perspective schematic view of a supporting stand 1000 in accordance with one embodiment of the present invention. The supporting stand 1000 of this embodiment includes abase 1, an upright 2, a holding unit 3, an electrical function unit 4 and an electrical connection unit 5. In this illustration, the upright 2 is associated with the base 1; the holding unit 3 is connected to the upright 2; the electrical function unit 4 is disposed within the base 1; and the electrical connection unit 5 is received in the interior of the upright 2, electrically connected to the electrical function unit 4 and extends to the holding unit 3. Accordingly, the supporting stand 1000 of the present invention can be placed on a working face (such as desk, not shown in the figure), whereas a display device (not shown in the figure) can be mounted on the holding unit 3 and electrically connected to the electrical function unit 4 in the interior of the base 1 through the electrical connection unit 5.

In the present invention, the holding unit 3 of the supporting stand 1000 can be adjustable or non-adjustable in height according to requirement. Hereafter, the holding unit 3 is illustrated to be adjustable in height for detailed description. As shown in FIG. 1, the holding unit 3 includes a sliding module 31 and a bracket 33 associated with the sliding module 31. The bracket 33 can hold a display device thereon, and the sliding module 31 can slide upward and downward in a channel 21 formed in the upright 2. Accordingly, the height of the display device can be adjusted by means of the sliding module 31 of the holding unit 3. The present invention is characterized in that the bracket 33 is provided with an anode conductive portion 33a and a cathode portion 33b that are electrically connected to the electrical function unit 4 through the electrical connection unit 5. When a display device is mounted on the bracket 33, the anode conductive portion 33a and the cathode conductive portion 33b would be brought into electrical connection with the anode and cathode contacts of the display device, respectively. As a result, by virtue of the anode and cathode conductive portions 33a, 33b of the bracket 33, the electrical connection unit 5 can provide electrical connection between the display device and the electrical function unit 4 at the base 1. For exemplary purposes, the electrical function unit 4 is illustrated to include a circuit board 41 and a light emitting module 43. By the anode and cathode conductive portions 33a, 33b of the bracket 33 and the electrical connection unit 5, the display device (not shown in the figure) mounted on the bracket 33 can provide electric power to the circuit board 41 at the base 1 and further to the light emitting module 43 electrically coupled to the circuit board 43. Accordingly, upon the display device being powered on, light can be emitted by the light emitting module 43 and pass outward from the interior of the base 1 through a window 11 of the base 1. For the supporting stand 1000 of the present invention, the electrical function unit 4 at the base 1 is not limited to the above-illustrated aspect, and may be configured to offer other function or multiple functions according to practical requirement. For instance, in addition to the above-mentioned light emitting module, the electrical function unit 4 may further include, but not limited to, an input/output module, a control module, an audio module or other multimedia modules. Additionally, depending on the design of the electrical function unit 4, the bracket 33 may be provided with two or more conductive portions for electrical connection with different function modules of the electrical function unit 4. Moreover, the electrical connection unit 5 is not limited to the function of power transmission, and also can be used for signal transmission. The power or signal also can be supplied from the electrical function unit 4 to the display device, and is not limited to the transmission from the display device to the electrical function unit 4.

The detailed structure of the supporting stand and the association among main components in accordance with the present invention are further illustrated as follows.

Figure 2:
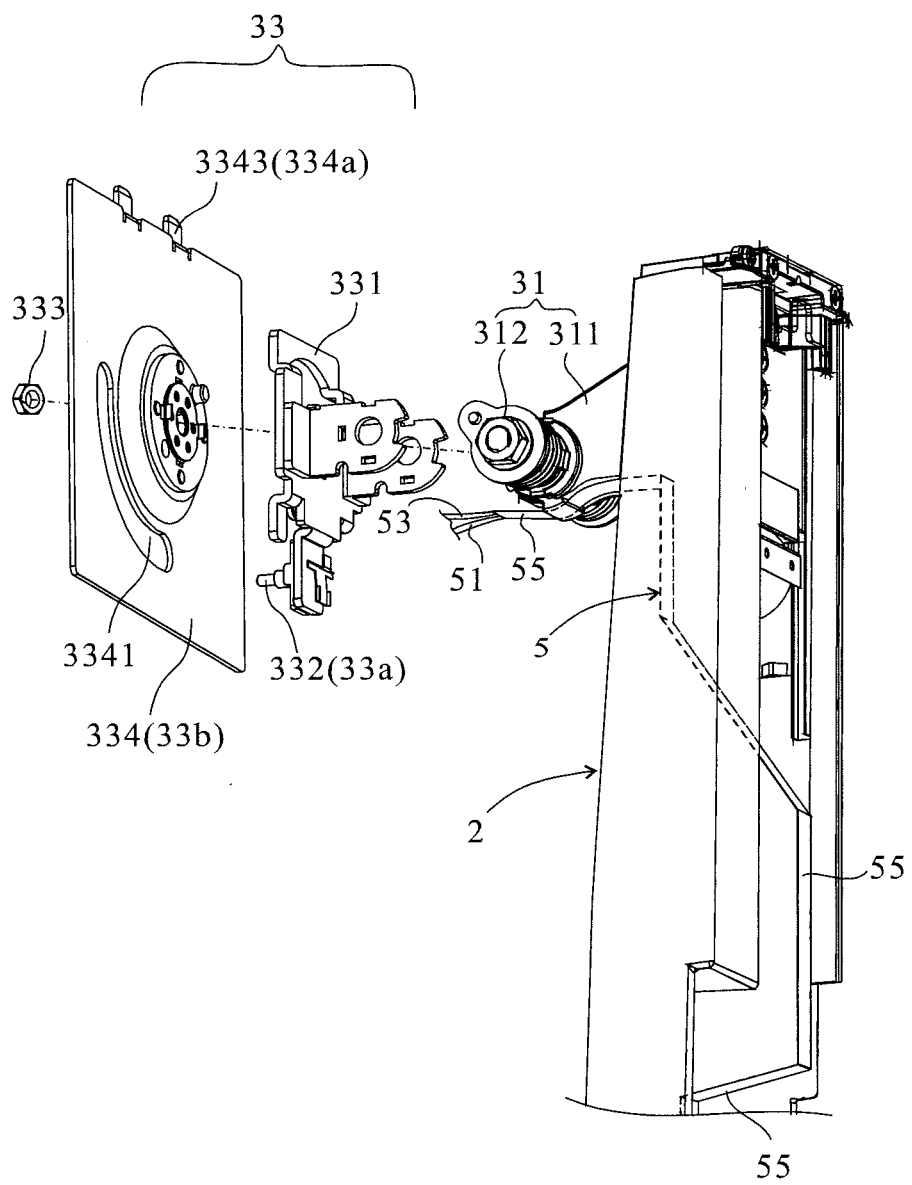
FIG. 2 is a partial exploded schematic view of the upper part of the supporting stand at one angular orientation in accordance with one embodiment of the present invention.
Figure 3:
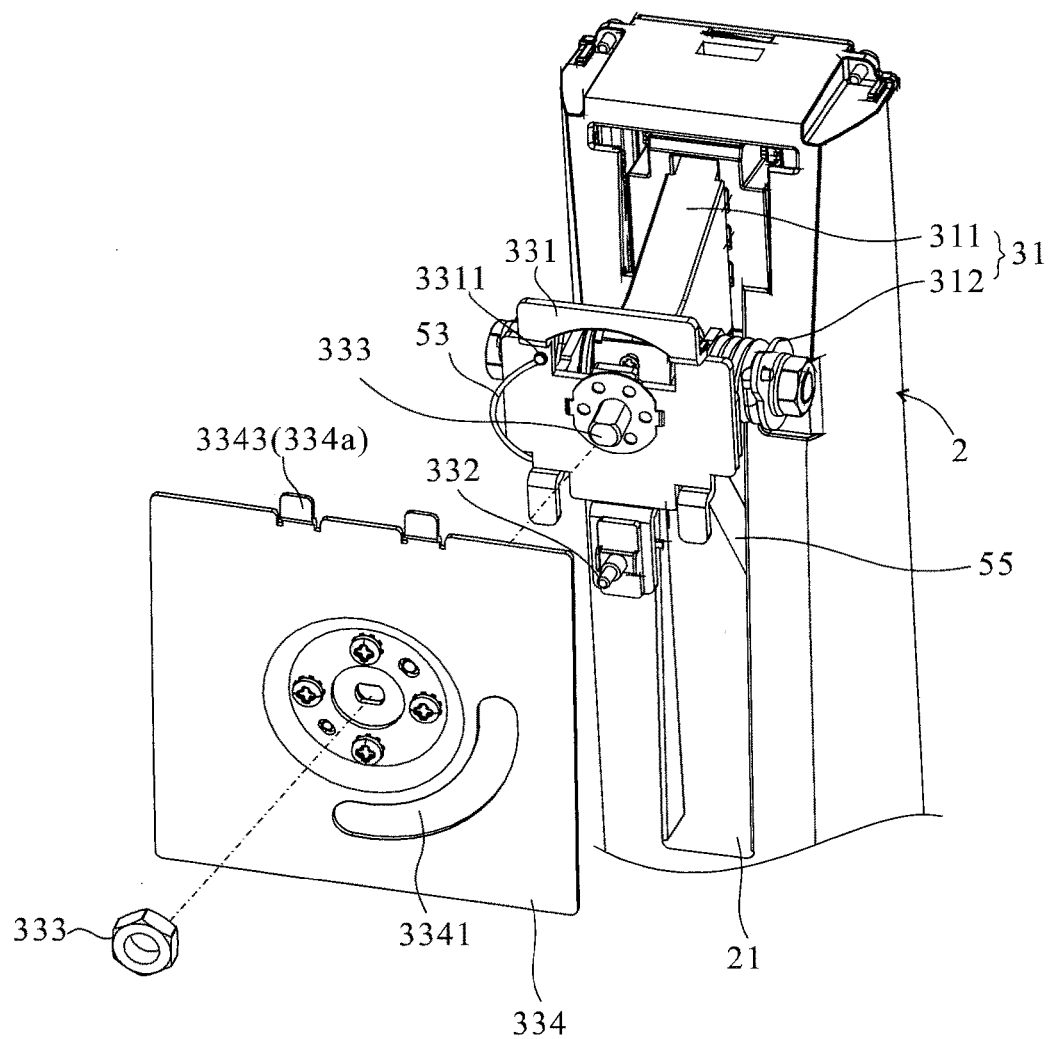
FIG. 3 is a partial exploded schematic view of the upper part of the supporting stand at another angular orientation in accordance with one embodiment of the present invention.
Figure 4:
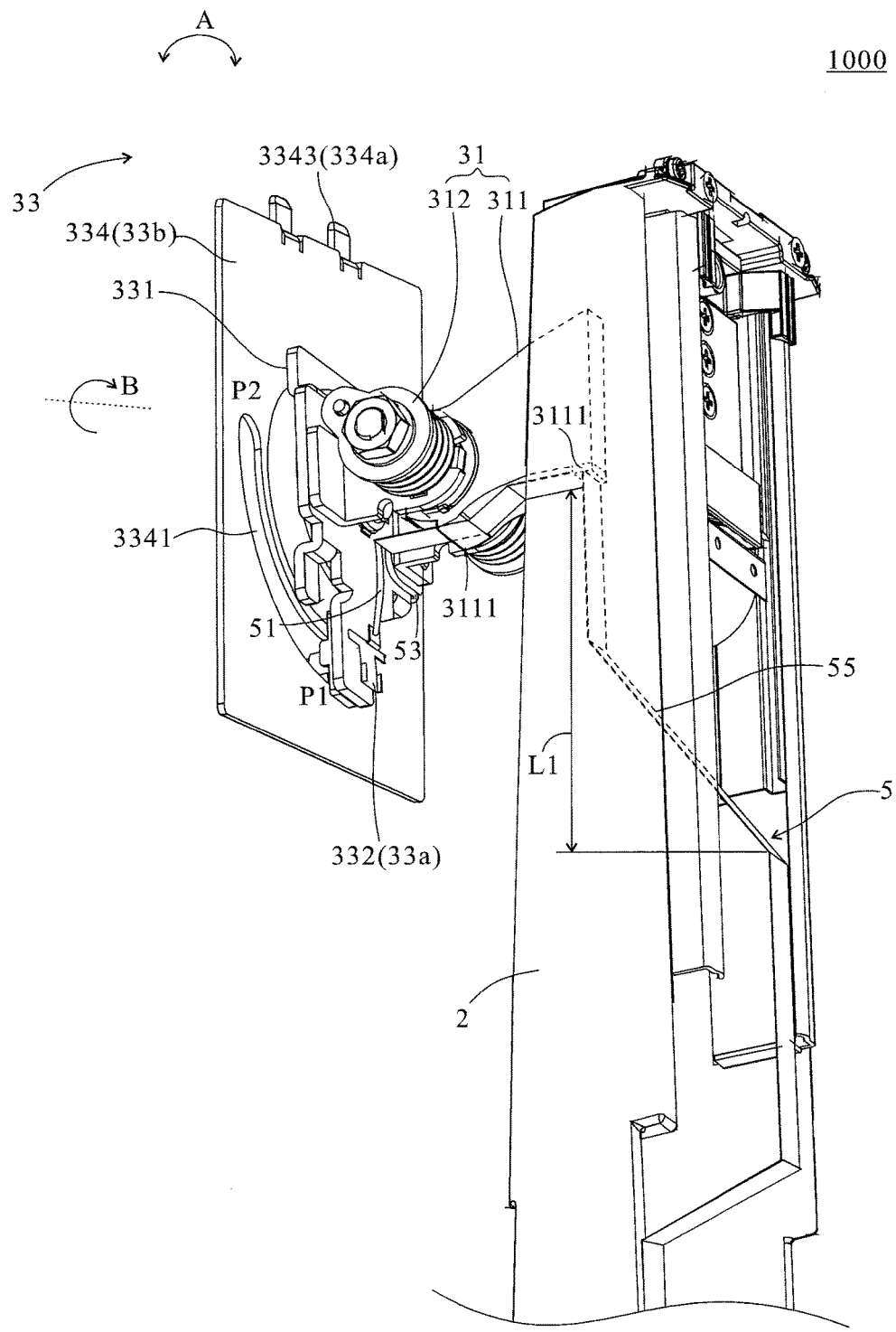
FIG. 4 is a perspective schematic view of the upper part of the supporting stand in accordance with one embodiment of the present invention.

Please refer to FIGS. 2-4, which are provided for detailed illustration of the upper part of the supporting stand 1000 with regard to the detail structure of components and the arrangement of the electrical connection unit. The holding unit 3 of the present invention can be non-pivotable, or may be configured to be pivotable according to practical requirement. In this embodiment, the holding unit 3 is illustrated as being pivotable for exemplary description.

As shown in FIGS. 2 and 3, which are partial exploded schematic views of the upper part of the supporting stand 1000 at different angular orientations, the sliding module 31 of the holding unit 3 has a slider 311 and a pivot structure 312. The slider 311 has one end associated with the pivot structure 312 and an opposite end slidably disposed at the channel 21 of the upright 2 (please referring to FIG. 3). Additionally, the bracket 33 of the holding unit 3 has a fixing plate 331, a pin connector 332, a shaft assembly 333 and a main plate 334. The rear side of the fixing plate 331 is pivotally attached to the pivot structure 312 of the sliding module 31. The shaft assembly 333 and the pin connector 332 are fastened on the fixing plate 331, and the main plate 334 is pivotably connected to the shaft assembly 333. Accordingly, as shown in FIG. 4, which is a perspective schematic view after assembling, the display device can be oriented to desired viewing angle by adjusting the forward/back tilt angle of the bracket 33 (as shown in arrow A), and also can be placed in landscape or portrait orientation by rotary motion of the main plate 334 about the shaft assembly 333 (as shown in arrow B).

In detail, as shown in FIGS. 2-4, the main plate 334 is formed with an open slot 3341 and two protrusions 3343, and the pin connector 332 fastened on the fixing plate 331 is electrically isolated from the main plate 334 and extends through the open slot 3341 from the rear side of the main plate 334. As a result, the pin connector 332 can be brought into direct electrical contact with an anode contact of the display device mounted on the front side of the bracket 33, whereas the protrusion 3343 of the main plate 33 can serve as a contact region 334a for electrical contact with a cathode contact of the display device. In the rotary motion of the bracket 33, the display device mounted on the bracket 33 can rotate with the main plate 334 about the shaft assembly 333, and the pin connector 332 fastened on the fixing plate 331 would keep stationary. As the rotary motion of the main plate 334 would cause the change in the relative position of the pin connector 332 at the open slot 3341, the open slot 3341 preferably is shaped according to the relative motion trajectory between the pin connector 332 and the main plate 334 induced by rotation of the bracket 33. As such, the pin connector 332 does not interfere with the rotary motion of bracket 33. In this exemplary aspect of the bracket 33 being configured to permit rotation of 90 degrees, the open slot 3341 can be formed into an arc, as shown in FIG. 4, adapted to the rotation of the bracket 33 from 0°-orientation to 90°-orientation. More specifically, the arc-shaped open slot 3341 is formed around a center point located on the axis (shown in dashed line in FIG. 3) of the shaft assembly 333, and the relative position of the pin connector 332 at the open slot 3341 would change from the "P1" location to the "P2" location of the open slot 3341 when the bracket 33 is rotated from 0°- to 90°-orientation.

Figure 5:
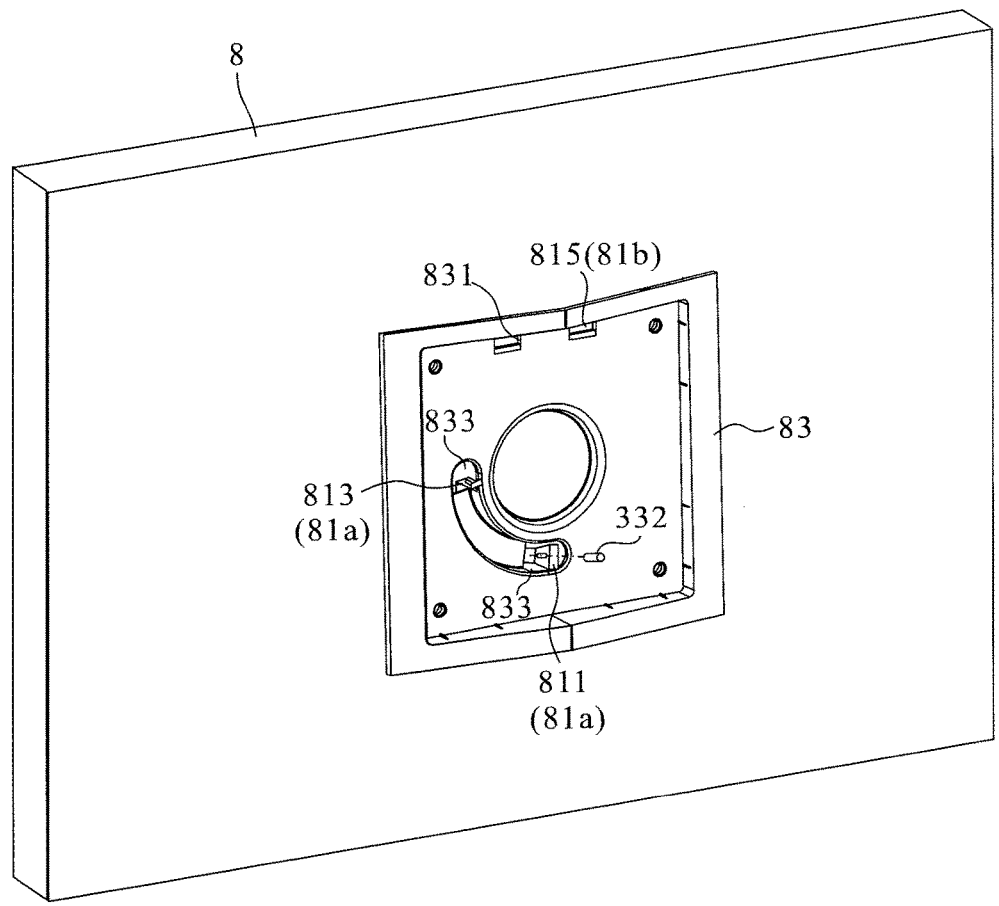
FIGS. 5 and 6 are perspective schematic views of a display device in 0°-orientation and 90°-orientation in accordance with one embodiment of the present invention.
Figure 6:
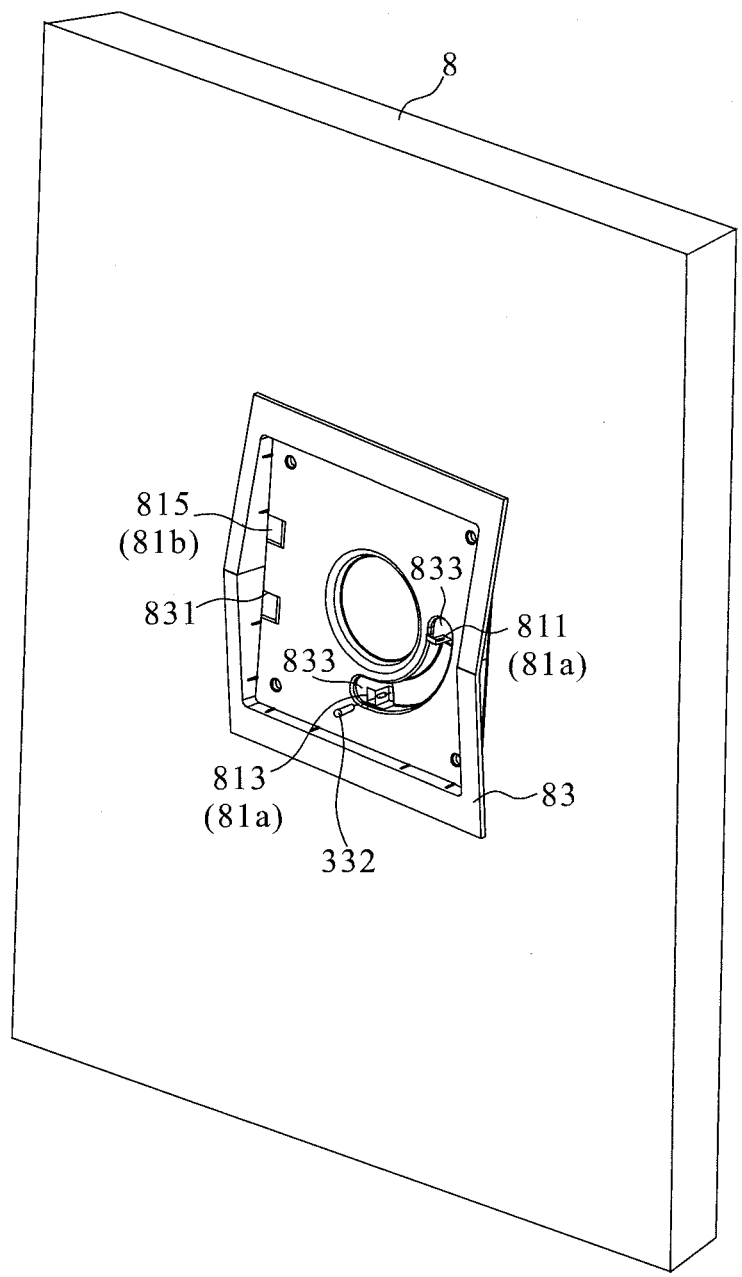

Attention is now directed to FIGS. 5 and 6 for detailed illustration of the configuration of the display device 8. In this illustration, the display device 8 is provided with two anode spring contacts 811, 813 and a cathode spring contact 815 at its rear side. The anode spring contacts 811, 813 can serve as anode contacts 81a of the display device 8 for electrical contact with the pin connector 332 in the position of the bracket 33 being in 0° and 90°-orientation. The cathode spring contact 815 can serve as a cathode contact 81b of the display device 8 for electrical contact with the protrusion 3343 of the main plate 334.

Following description is provided for the aspect of the display device 8 being equipped with a quick release structure 83 at its rear side. The top edge of the quick release structure 83 can be firmly associated with the top edge of the main plate 334 by engaging the two protrusions 3343 of the main plate 334 in two recesses 831 at the top edge of the quick release structure 83. As such, one of the protrusions 3343 of the main plate 334 can abut and press on the cathode spring contact 815 disposed in one of the recesses 831. Likewise, please referring to FIG. 5, the pin connector 332 can be guided to abut and press on the anode spring contact 811 by engaging the bottom edge of the quick release structure 83 with the bottom edge of the main plate 334. As a result, the display device 8 can be electrically connected to the electrical function unit 4 through the electrical connection unit 5 to form an electrical loop by the electrical contact between the anode contact 81a of the display device 8 and the anode conductive portion 33a of the bracket 33 and between the cathode contact 81b of the display device 8 and the cathode conductive portion 33b of the bracket 33. Additionally, when the display device 8 is rotated from landscape orientation (as shown in FIG. 5) to portrait orientation (as shown in FIG. 6), the other anode spring contact 813 of the display device 8 would move with the rotation to be aligned with and pressed by the pin connector 332. As a result, the display device in 0°- or 90°-orientation can be electrically connected to the circuit board 41 at the base 1 and drive the light emitting module 43 to emit light. On the contrary, since other orientations than landscape and portrait during rotation from FIG. 5 to FIG. 6 would cause the pin connector 332 in non-contact with the anode spring contact 811 or 813 and result in open circuit, no light is emitted by the light emitting module 43.

The use of spring contacts as the anode and cathode contacts 81a, 81b has advantages of close contact with the pin connector 332 and the protrusion 3343, larger assembly tolerance, reduced mechanic interference and lower risk of being scratched or broken. In particular, as the anode spring contacts 811, 813 each has much larger contactable area than that of the pin connector 332, the pin connector 332 can be smoothly placed in contact with anode spring contact 811, 813 when mounting the display device 8 on the bracket 33. Additionally, compared to the traditional plug-and-socket connection, the contact-type connection between the pin connector 332 and the anode spring contact 811, 813 can make the detaching operation of the display device 8 from the bracket 33 much easier because no resistance need to be overcome for detaching. In other words, no additional plugging-in or pulling-away action is required for electrical connection or disconnection between the display device 8 and the supporting stand 1000 of the present invention. In this embodiment, the quick release structure 83 is further provided with guide trenches 833 corresponding to the locations of the anode spring contacts 811, 813 to permit the pin connector 332 to be slidably disposed therein and thus to make the display device 8 more smoothly mounted on the bracket 33 without undesired mechanic interference.

Attention is now directed back to FIG. 4 for detailed illustration of the arrangement of the electrical connection unit 5 at the bracket 33. In this embodiment, the electrical connection unit 5 is illustrated to have a first cable 51, a second cable 52 and a main cable 55 for exemplary description.

The first cable 51 has one end electrically connected to the main cable 55 and an opposite end electrically connected to the pin connector 332. Likewise, the second cable 53 has one end electrically connected to the main cable 55 and an opposite end electrically connected to an electrical joint structure 3311 (shown in FIG. 3) at the front side of the main plate 331. The electrical joint structure 3311 of the fixing plate 331 is disposed in direct electrical contact with the rear side of the main plate 334 and thus electrically connected to the contact region 334a of the main plate 334. Accordingly, the display device can be electrically connected to the electrical connection unit 5 through the pin connector 332 as the anode conductive portion 33a and the main plate 334 as the cathode conductive portion 33b.

In this embodiment, the main cable 55 is disposed in the interior of the upright 2 to avoid exposed cables and thus to give the supporting stand a cohesive feel. Further, in consideration of the easy routing of the main cable 55 within the upright 2, a flexible flat cable is used as the main cable 55 in this embodiment. This aspect of incorporating the main cable 55 into the interior of the upright 2 is provided only for exemplary explanation. The arrangement of the main cable 55 should not be limited to the exemplary embodiment illustrated below, and any other routing aspect for electrically connecting the main cable 55 to the base 1 is feasible for the present invention.

Please referring back to FIG. 1, the interior of the upright 2 is formed with a receiving trough 23 that can accommodate the main cable 55 and define the shortest pathway for routing the first cable 51 and the second cable 53 to the base 1. The main cable 55 in the receiving trough 23 is arranged to have a number of bent portions and longer than the shortest pathway.

Figure 7:
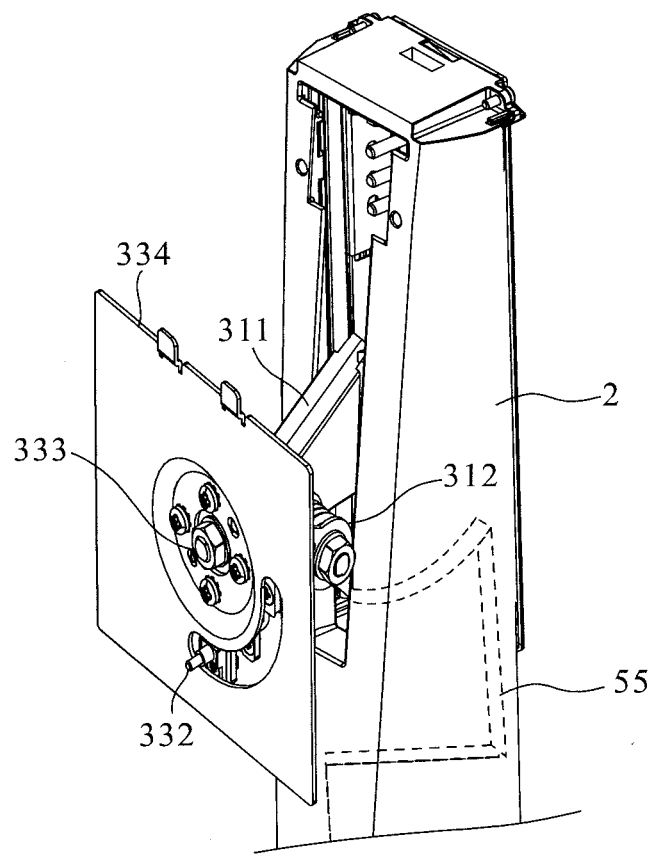
FIG. 7 is a perspective schematic view of a supporting stand in which the holding unit is shifted to the lowest position in accordance with one embodiment of the present invention.

Reference is next made to FIGS. 4-7 for illustrating the arrangement of the upper part of the main cable 55. The main cable 55 has an upper portion fastened to the bottom of the slider 311 of the sliding module 31 and an elongated portion extending toward the base 1 along the upright 2. The bottom of the slider 311 is provided with two retaining rings 3111 to permit passage of the main cable 55. By the retaining rings 3111 and a backsize, the main cable 55 can be firmly fastened to the slider 311. Further, the main cable 55 has a free section L1 corresponding to the channel 21 of the upright 2 to permit upward and downward motion of the sliding module 31 along the channel 21 at the front side of the upright 2. Both opposite ends of the free section L1 are respectively attached to the sliding module 31 at the front side of the upright 2 and fastened adjacent the rear side of the upright 2. The middle portion of the free section L1 between the opposite ends can be forced into bending and thus adapted to the sliding motion of the sliding module 31. The subsequent section (below the free section) of the main cable 55 can be fastened to the upright 2 by a backsize and retaining rings (not shown in figures) and longitudinally extends downward along the upright 2. Accordingly, when the sliding module 31 at the position as shown in FIG. 4 is shifted to lower position as shown in FIG. 7, the end of the free section L1 fastened adjacent the rear side of the upright 2 is maintained stationary, and the other end would move with the sliding module 31 to conform to the motion of the sliding module 31.

Figure 8:
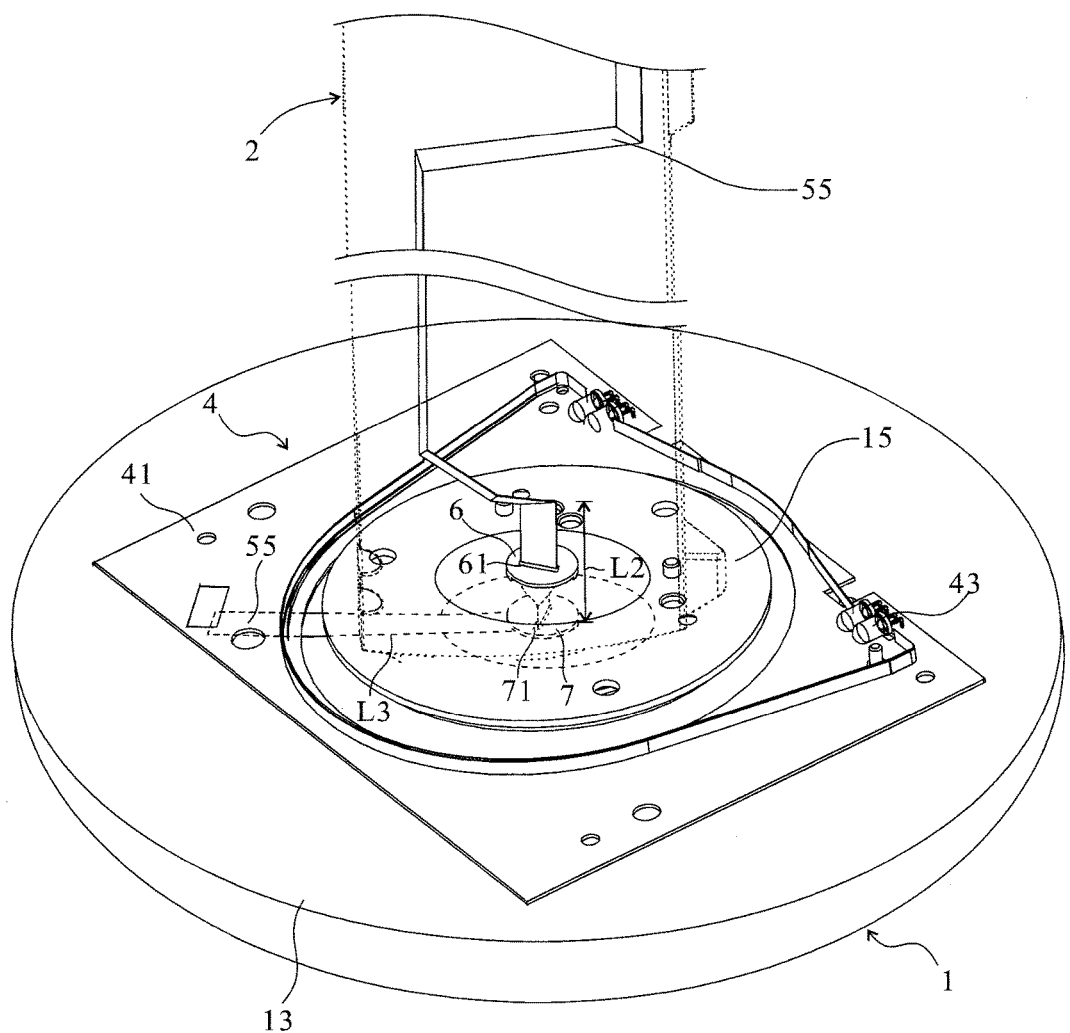
FIG. 8 is a perspective schematic view of the lower part of the supporting stand in accordance with one embodiment of the present invention.

FIG. 8 is provided to further illustrate the lower part of the supporting stand 1000 with regard to the detail structure of components and the arrangement of the electrical connection unit. In this embodiment, the upright 2 is illustrated as being rotatable for exemplary description. As shown in FIG. 8, which is perspective schematic view of the lower part of the supporting stand 1000, the base 1 has a fixing baseplate 13 and a rotary plate 15 disposed on the fixing baseplate 13. The rotary plate 15 is associated with the bottom of the upright 2 and rotatable with respect to the fixing baseplate 13, so that the display device can be oriented to face in a desired direction by pivot motion of the upright 2. Following the above-illustrated arrangement of the main cable 55 in the upper part of the upright 2, the subsequent section of the main cable 55 extends toward the base 1 along the lower part of the upright 2 and is formed with a bent portion at the base 1 and further laterally extends from the bent portion to an electrical joint site of the electrical function unit 4. The main cable 55 can be routed in any suitable manner according to the configuration of the lower part of the upright 2, and is not limited to the arrangement illustrated in this embodiment. Preferably, the main cable 55 has a reserve section L2 longitudinally extending to the base 1, so that the main cable 55 permits twisting in the reserve section L2 to conform to the pivot motion of the upright 2. In detail, since the cable length of the reserve section L2 is larger than its corresponding longitudinal pathway distance extending to the base 1, the event of cable breaking caused by excessive tightening force in pivot motion of the upright 2 can be avoided.

Additionally, the supporting stand 1000 of this embodiment further includes a first organizer 6 and a second organizer 7 near the junction between the upright 2 and the base 1 to reduce the friction or interference between the main cable 55 and other components. The first organizer 6 is disposed at the rotary plate 15, whereas the second organizer 7 is disposed at the fixing baseplate 13. The reserve section L2 of the main cable 55 longitudinally extends toward the base 1 and passes through the first organizer 6 and the second organizer 7 in sequence. By the second organizer 7, the main cable 55 is formed with a bent portion at the base 1, and further has a lateral extension section L3 that laterally extends from the bent portion and is electrically connected to the electrical function unit 4. In this embodiment, the first organizer 6 and the second organizer 7 have disc-like shape and are formed with through openings 61, 71 at their center to permit passage of the main cable 55, but are not limited thereto.

In the initial state of the upright 2 being not pivoted to a pivot angle, the reserve section L2 of the main cable 55 within the upright 2 is in a relaxed state and not tensioned because the cable length of the reserve section L2 is larger than its corresponding minimum pathway distance (for figure simplicity, the reserve section L2 being not illustrated in the relaxed state). When pivotally rotating the upright 2 with respect to the base 1, the second organizer 7 is maintained stationary, and the first organizer 6 would rotate synchronously with the upright 2 and the rotary plate 15 and cause cable twisting in the reserve section L2. In order to avoid breaking of the main cable 55 resulting from excessive tightening force in rotation of the upright 2, the cable length of the reserve section L2 of the main cable 55 preferably is determined depending on the angle of rotability of the upright 2.

Accordingly, the electrical function unit built in the supporting stand can be electrically connected to the display device mounted thereon through the conductive portions of the bracket. Further, when releasing the display device from the supporting stand, the conductive portions can be easily separated from the display device and thus beneficial for a detachable supporting stand.

The above examples are intended for illustrating the embodiments of the subject invention and the technical features thereof, but not for restricting the scope of protection of the subject invention. Many other possible modifications and variations can be made without departing from the spirit and scope of the invention as hereinafter claimed. The scope of the subject invention is based on the claims as appended.

What is claimed is:

1. A supporting stand for a display device having an anode contact and a cathode contact, comprising:
    a base;
    an upright, connected to the base;
    a holding unit, connected to the upright and including a bracket for mounting the display device thereon, wherein the bracket has an anode conductive portion and a cathode conductive portion;
    an electrical function unit, disposed within the base; and
    an electrical connection unit, extending through an interior of the upright and electrically connecting the electrical function unit to the anode conductive portion and the cathode conductive portion of the bracket, wherein by virtue of mounting the display device on the bracket, the anode conductive portion and the cathode conductive portion are can be thereby brought into abutment against the anode contact and the cathode contact, respectively, so that the display device is electrically connected to the anode conductive portion and the cathode conductive portion of the bracket and further to the electrical function unit through the electrical connection unit to form an electrical loop.

2. The supporting stand of claim 1, wherein the anode conductive portion of the bracket is a pin connector and the anode contact of the display device is at least one anode spring contact, the pin connector being brought into contact with the anode spring contact by mounting the display device on the bracket, and being brought into non-contact with the anode spring contact by releasing the display device from the bracket.

3. The supporting stand of claim 2, wherein the cathode conductive portion of the bracket is a main plate, and the pin connector is electrically isolated from the main plate and extends through an open slot of the main plate.

4. The supporting stand of claim 3, wherein the main plate is provided with a contact region and the cathode contact of the display device is a cathode spring contact, the contact region being brought into contact with the cathode spring contact by mounting the display device on the bracket, and being brought into non-contact with the cathode spring contact by releasing the display device from the bracket.

5. The supporting stand of claim 4, wherein the main plate has a protrusion as the contact region and the cathode spring contact is disposed in a recess of the display device, the protrusion being brought into contact with the cathode spring contact by engaging the protrusion in the recess when mounting the display device on the bracket.

6. The supporting stand of claim 3, wherein the main plate is rotatable and the pin connector keeps stationary in rotation of the main plate, therewith the relative position of the pin connector at the open slot changing with rotation of the main plate.

7. The supporting stand of claim 6, wherein the at least one anode spring contact is two anode spring contacts, the pin connector being in contact with one of the anode spring contacts when the display device on the bracket being oriented in portrait view, and being in contact with the other of the anode spring contacts when the display device on the bracket being oriented in landscape view.

8. The supporting stand of claim 6, wherein the open slot has a shape determined by the relative motion trajectory between the pin connector and the main plate induced by rotation of the main plate.

9. The supporting stand of claim 6, wherein (i) the bracket further has a fixing plate and a shaft assembly, (ii) the pin connector is fastened to the fixing plate, (iii) the main plate and the fixing plate are pivotally attached to the shaft assembly, and (iv) the main plate is rotatable about the shaft assembly, and the fixing plate is maintained stationary in rotation of the main plate.

10. The supporting stand of claim 9, wherein (i) the electrical connection unit includes a first cable and a second cable, (ii) the first cable is electrically connected to the pin connector, (iii) the second cable is electrically connected to an electrical joint structure of the fixing plate, and (iv) the electrical joint structure is in electrical contact with the main plate to provide electrical connection between the main plate and the second cable.

11. The supporting stand of claim 1, wherein (i) the electrical connection unit includes a main cable, (ii) the interior of the upright is formed with a receiving trough that defines a shortest pathway between the holding unit and the base, and (iii) the main cable is disposed in the receiving trough and electrically connected to the electrical function unit and longer than the shortest pathway.

12. The supporting stand of claim 11, wherein (i) the upright is rotatable with respect to the base, (ii) the main cable has a reserve section longitudinally extending to the base, and (iii) the reserve section of the main cable is in a relaxed state when the upright is not pivoted to a pivot angle and allows twisting adapted to pivot motion of the upright.

13. The supporting stand of claim 12, wherein the difference between a cable length of the reserve section and a minimal pathway distance corresponding to the reserve section is determined by angle of rotability of the upright.

14. The supporting stand of claim 12, further comprising a first organizer and a second organizer, wherein the reserve section of the main cable longitudinally extends through the first organizer and the second organizer in sequence in a direction toward the base, and the main cable is formed with a bent portion by the second organizer at the base and laterally extends from the bent portion to form an lateral extension section electrically connected to the electrical function unit.

15. The supporting stand of claim 11, wherein (i) the holding unit is capable of sliding upward and downward in a channel of the upright, (ii) the main cable has a free section corresponding to the channel, and (iii) the free section is can be forced into bending to be adapted to sliding motion of the holding unit.

* * * * *